(12) United States Patent
Bae et al.

(10) Patent No.: US 12,710,460 B2
(45) Date of Patent: Aug. 18, 2026

(54) ELECTROMAGNETICALLY INDUCED GRATING-BASED ELECTRIC FIELD DETECTION SYSTEM AND METHOD

(71) Applicant: KOREA RESEARCH INSTITUTE OF STANDARDS AND SCIENCE, Daejeon (KR)

(72) Inventors: In Ho Bae, Daejeon (KR); Seon Do Lim, Daejeon (KR); No Weon Kang, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 228 days.

(21) Appl. No.: 18/684,882

(22) PCT Filed: Dec. 21, 2021

(86) PCT No.: PCT/KR2021/019480
§ 371 (c)(1),
(2) Date: Feb. 20, 2024

(87) PCT Pub. No.: WO2023/113082
PCT Pub. Date: Jun. 22, 2023

(65) Prior Publication Data

US 2024/0353459 A1 Oct. 24, 2024

(30) Foreign Application Priority Data

Dec. 13, 2021 (KR) ........................ 10-2021-0177430

(51) Int. Cl.
*G01R 29/08* (2006.01)
*G01R 29/12* (2006.01)

(52) U.S. Cl.
CPC ......... *G01R 29/0885* (2013.01); *G01R 29/12* (2013.01)

(58) Field of Classification Search
CPC .... G01R 29/12; G01R 29/08; G01R 29/0871; G01R 29/0885; G01R 29/0892;
(Continued)

(56) References Cited

U.S. PATENT DOCUMENTS

2016/0363617 A1 12/2016 Anderson et al.
2020/0292606 A1 9/2020 Holloway et al.
(Continued)

FOREIGN PATENT DOCUMENTS

CN 113138312 A 7/2021
CN 113376446 A 9/2021

OTHER PUBLICATIONS

International Search Report issued in PCT Application No. PCT/KR2021/019480, mailed on Sep. 2, 2022.
(Continued)

*Primary Examiner* — Lee E Rodak
*Assistant Examiner* — Jeremiah J Barron
(74) *Attorney, Agent, or Firm* — DILWORTH IP, LLC

(57) ABSTRACT

An electromagnetically induced grating-based electric field detection system and method are provided, which enable the creation of an electromagnetically induced transparency grating using a low-wavelength laser and enables real-time electromagnetic wave measurement by avoiding the frequency reprocessing of the signal that is essential in the existing Rydberg atom-based electric field measurement technology. The detection system may include a vapor cell; an irradiation light source which irradiates irradiation light to be incident on the vapor cell; a combined light source which irradiates combined light to be incident on the vapor cell; a reflector which reflects the combined light that has passed through the vapor cell and makes it incident on the vapor cell; an electromagnetic wave generator which generates an electromagnetic wave to be incident on one side
(Continued)

surface of the vapor cell; and a reflected light detector which detects a reflected light released from the vapor cell.

9 Claims, 4 Drawing Sheets

(58) Field of Classification Search
CPC .... G01R 29/0864; G01R 15/22; G01R 15/24; G01R 15/248; G01R 15/26; G01R 23/17; G01R 25/04
See application file for complete search history.

(56) References Cited

U.S. PATENT DOCUMENTS

| | | | | |
|---|---|---|---|---|
| 2020/0295838 | A1 | 9/2020 | Gordon et al. | |
| 2021/0250101 | A1 | 8/2021 | Gordon et al. | |
| 2023/0058843 | A1 * | 2/2023 | Bucklew ............ | G01R 29/0878 |
| 2024/0159809 | A1 * | 5/2024 | Burton ............... | G01R 29/0885 |

OTHER PUBLICATIONS

Office Action from Korea Patent Office in Application No. KR 10-2021-0177430 dated Sep. 19, 2023.

* cited by examiner

Absorption —— node

EIT – – – – – – – anti-node

ELECTROMAGNETICALLY INDUCED GRATING-BASED ELECTRIC FIELD DETECTION SYSTEM AND METHOD

TECHNICAL FIELD

The present disclosure relates to an electromagnetically induced grating-based electric field detection system and method and, more particularly, to an electric field detection system and method which enable the creation of an electromagnetically induced transparency grating using a standing wave laser and enable real-time electromagnetic wave measurement by avoiding the frequency reprocessing of the signal that is essential in the existing Rydberg atom-based electric field measurement technology.

BACKGROUND ART

The conventional Rydberg atomic system-based electric field detection technology is based on the Rydberg atomic system generated using lasers represented by irradiation light and combined light, and is a technology that senses the electric field and measures the magnitude of the electromagnetic field by reading the Autler-Towns splitting frequency of the electromagnetically induced transparency signal generated when an electric field is applied to the Rydberg atomic system.

In particular, the conventional Rydberg atomic system-based electric field detection technology is essentially required to measure in real time the difference in frequencies at which Autler-Towns splittings occur, and for this purpose, it additionally needs a saturated absorption spectroscopy system to determine the exact frequency value.

In other words, it is essential to convert the time scale of the saturated absorption spectroscopy signal of an atom to the frequency domain according to the calculated value, and then reprocess it to the entire Autler-Towns splitting signal to reconvert the scale to the frequency band.

However, there is a problem in that in order to monitor the difference in frequencies in real time, it is required to scan the laser frequency always and execute a complex signal monitoring program together.

Accordingly, in order to efficiently measure electric fields in real time, it is needed to develop a new measurement method that can measure other factors variable according to the magnitude of the electric field at a locked frequency in replacement of the frequency measurement method.

DISCLOSURE

Technical Problem

The present disclosure has been conceived in order to address the above-described drawbacks, and the purpose of the present disclosure is to provide a system and method for detecting an electric field using standing wave coupled light periodically modulated in a Rydberg atomic system.

Technical Solution

An embodiment of this disclosure provides an electromagnetically induced grating-based electric field detection system.

An electromagnetically induced grating-based electric field detection system according to an embodiment of the present disclosure may include a vapor cell; an irradiation light source which irradiates irradiation light to be incident on one end of the vapor cell; a combined light source which irradiates combined light to be incident on another end of the vapor cell; a reflector which reflects the combined light that has passed through the vapor cell and makes it incident on the one end of the vapor cell; an electromagnetic wave generator which generates an electromagnetic wave to be incident on one side surface of the vapor cell; and a reflected light detector which detects a reflected light released from the vapor cell.

In an electromagnetically induced grating-based electric field detection system according to an embodiment of the present disclosure, the combined light may have a wavelength of 480 nm.

An electromagnetically induced grating-based electric field detection system according to an embodiment of the present disclosure may further include a dichroic mirror which is disposed between the one end of the vapor cell and the reflector, and through which the combined light that has passed through the vapor cell passes.

An electromagnetically induced grating-based electric field detection system according to an embodiment of the present disclosure may further include a collimator which converts the irradiation light or the combined light to be incident on the vapor cell into parallel light.

In an electromagnetically induced grating-based electric field detection system according to an embodiment of the present disclosure, the reflected light detector includes a measuring part of reflected light which measures the intensity of the reflected light released from the vapor cell; a calculating part of change amount of reflected light which calculates the amount of change in the reflected light caused by the electromagnetic wave incident on the vapor cell; and an electromagnetic wave calculating part which calculates the intensity and phase of the electromagnetic wave incident on the vapor cell based on the amount of change in the reflected light.

An embodiment of this disclosure provides an electromagnetically induced grating-based electric field detection method.

An electromagnetically induced grating-based electric field detection method according to an embodiment of the present disclosure may include generating an electromagnetically induced transparency signal in which irradiation light and combined light are incident on a vapor cell in opposite directions to generate a Rydberg electromagnetically induced transparency signal; generating a standing wave in which the combined light that has passed through the vapor cell is reflected through a reflector, so that the reflected combined light is incident on the vapor cell to generate a standing wave; generating reflected light in which the reflected light is released from the vapor cell by adjusting an angle at which the irradiation light is incident on the vapor cell; and calculating an electromagnetic wave in which the electromagnetic wave is incident on the vapor cell through an electromagnetic wave generator, and then, based on an amount of change in the reflected light caused by the incident electromagnetic wave, the intensity and phase of the electromagnetic wave are calculated.

In an electromagnetically induced grating-based electric field detection method according to an embodiment of the present disclosure, the wavelength of the combined light may be in a range from 479 nm to 489 nm.

In an electromagnetically induced grating-based electric field detection method according to an embodiment of the present disclosure, in the step of generating the standing wave, the combined light may pass through a dichroic mirror and then be reflected using the reflector.

In an electromagnetically induced grating-based electric field detection method according to an embodiment of the present disclosure, the step of calculating the electromagnetic wave includes measuring the reflected light released from the vapor cell through a measuring part of reflected light; allowing an electromagnetic wave to be incident on the vapor cell through an electromagnetic wave generator; calculating the amount of change in the reflected light caused by the electromagnetic wave incident on the vapor cell through the calculating part of change amount; and calculating the intensity and phase of the electromagnetic wave based on the amount of change in the reflected light through the electromagnetic wave calculating part.

Advantageous Effects

According to one embodiment of the present disclosure, in the Rydberg atom-based electric field measurement technology, there is an advantage in that real-time electric field measurement is possible without signal frequency reprocessing.

Additionally, according to an embodiment of the present disclosure, there is an advantage in that the reflected light can be generated only by simple manipulation of the combined light.

Advantageous effects which can be obtained from the present disclosure are not limited to the aforementioned ones, and other advantageous effects not mentioned above can be understood from the following detailed description by a person having ordinary skill in the art to which the disclosure belongs.

BEST MODE FOR INVENTION

Figure 1:
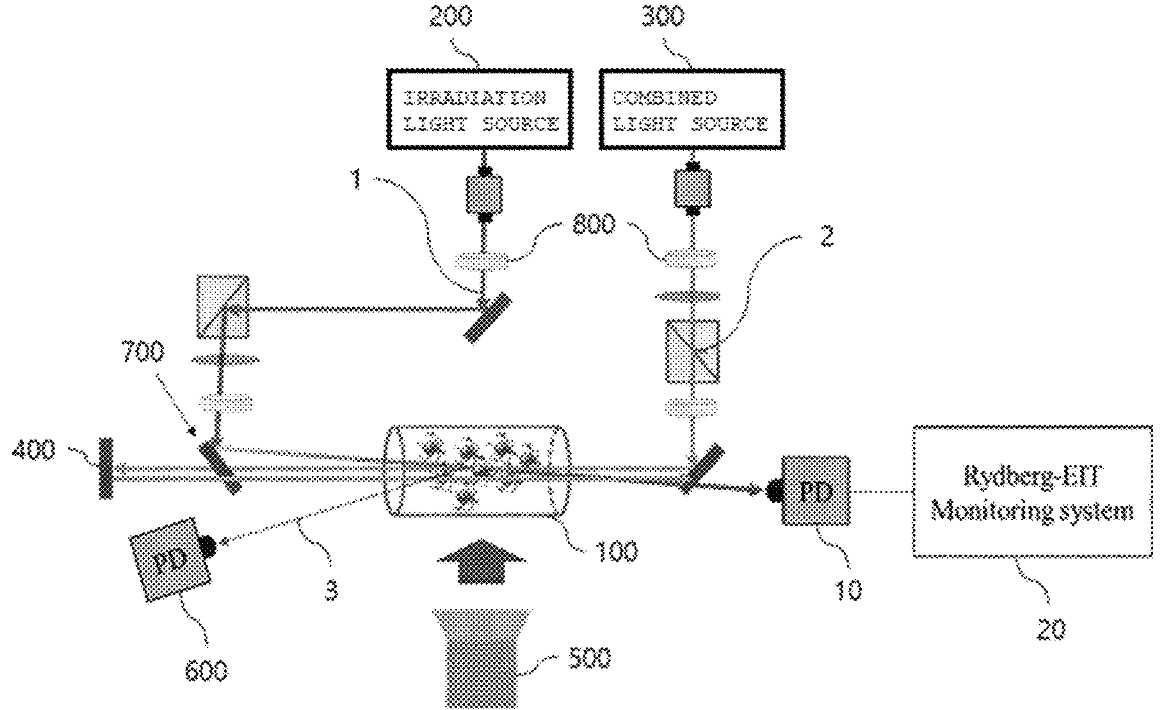
FIG. 1 is a schematic diagram of an electromagnetically induced grating-based electric field detection system according to an embodiment of the present disclosure.

An embodiment of this disclosure provides an electromagnetically induced grating-based electric field detection system.

An electromagnetically induced grating-based electric field detection system according to an embodiment of the present disclosure may include a vapor cell; an irradiation light source which irradiates irradiation light to be incident on one end of the vapor cell; a combined light source which irradiates combined light to be incident on another end of the vapor cell; a reflector which reflects the combined light that has passed through the vapor cell and makes it incident on the one end of the vapor cell; an electromagnetic wave generator which generates an electromagnetic wave to be incident on one side surface of the vapor cell; and a reflected light detector which detects a reflected light released from the vapor cell.

In an electromagnetically induced grating-based electric field detection system according to an embodiment of the present disclosure, the combined light may have a wavelength of 480 nm.

An electromagnetically induced grating-based electric field detection system according to an embodiment of the present disclosure may further include a dichroic mirror which is disposed between the one end of the vapor cell and the reflector, and through which the combined light that has passed through the vapor cell passes.

An electromagnetically induced grating-based electric field detection system according to an embodiment of the present disclosure may further include a collimator which converts the irradiation light or the combined light to be incident on the vapor cell into parallel light.

In an electromagnetically induced grating-based electric field detection system according to an embodiment of the present disclosure, the reflected light detector includes a measuring part of reflected light which measures the intensity of the reflected light released from the vapor cell; a calculating part of change amount of reflected light which calculates the amount of change in the reflected light caused by the electromagnetic wave incident on the vapor cell; and an electromagnetic wave calculating part which calculates the intensity and phase of the electromagnetic wave incident on the vapor cell based on the amount of change in the reflected light.

An embodiment of this disclosure provides an electromagnetically induced grating-based electric field detection method.

An electromagnetically induced grating-based electric field detection method according to an embodiment of the present disclosure may include generating an electromagnetically induced transparency signal in which irradiation light and combined light are incident on a vapor cell in opposite directions to generate a Rydberg electromagnetically induced transparency signal; generating a standing wave in which the combined light that has passed through the vapor cell is reflected through a reflector, so that the reflected combined light is incident on the vapor cell to generate a standing wave; generating reflected light in which the reflected light is released from the vapor cell by adjusting an angle at which the irradiation light is incident on the vapor cell; and calculating an electromagnetic wave in which the electromagnetic wave is incident on the vapor cell through an electromagnetic wave generator, and then, based on an amount of change in the reflected light caused by the incident electromagnetic wave, the intensity and phase of the electromagnetic wave are calculated.

In an electromagnetically induced grating-based electric field detection method according to an embodiment of the present disclosure, the wavelength of the combined light may be in a range from 479 nm to 489 nm.

In an electromagnetically induced grating-based electric field detection method according to an embodiment of the present disclosure, in the step of generating the standing wave, the combined light may pass through a dichroic mirror and then be reflected using the reflector.

In an electromagnetically induced grating-based electric field detection method according to an embodiment of the present disclosure, the step of calculating the electromagnetic wave includes measuring the reflected light released from the vapor cell through a measuring part of reflected light; allowing an electromagnetic wave to be incident on the vapor cell through an electromagnetic wave generator; calculating the amount of change in the reflected light caused by the electromagnetic wave incident on the vapor cell through the calculating part of change amount; and calculating the intensity and phase of the electromagnetic wave based on the amount of change in the reflected light through the electromagnetic wave calculating part.

Mode for Invention

Hereinafter, embodiments of the present disclosure will be described in detail with reference to the accompanying drawings such that those of ordinary skill in the art can easily practice them. However, the disclosure can be embodied in various different forms, and the scope of the disclosure should not be construed as being limited to the embodiments described herein. In the drawings, in order to describe clearly the disclosure, parts not related to the description are omitted, and like reference signs will be given to like constitutional elements throughout the specification.

The terms used in this specification will be briefly explained, and then the present disclosure will be described in detail.

The terms used in the present disclosure have been selected from among general terms currently widely used as many as possible while considering their functions in the present disclosure, but this may vary depending on the intentions of engineers working in the art, precedents, the emergence of new technologies, or the like. In addition, in certain cases, there are terms arbitrarily selected by the applicant, and in this case, their meanings will be described in detail in the description of the relevant disclosure. Therefore, the term used in the disclosure should be defined based on not a simple term name but the meaning of the term and the entire contents of the disclosure.

Throughout this specification, when a part "includes" or "comprises" a component, it means not that the part excludes other component, but instead that the part may further include other component unless explicitly stated to the contrary. In addition, terms such as " . . . part" and " . . . module" described in the specification mean a part that processes at least one function or operation, which may be implemented in hardware or software, or a combination of hardware and software. Further, as used herein, "connecting" a part with another part may refer to a case where they are "indirectly connected" to each other with other element intervening therebetween, as well as a case where they are directly connected.

Hereinafter, the present disclosure will be described in detail with reference to the accompanying drawings.

FIG. 1 is a schematic diagram of an electromagnetically induced grating-based electric field detection system according to an embodiment of the present disclosure.

Figure 2:
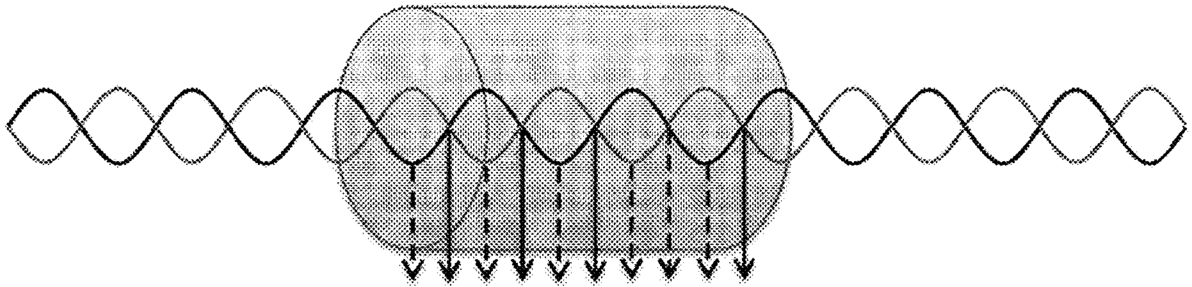
FIG. 2 is a diagram for explaining the phenomenon of electromagnetically induced grating formed by an embodiment of the present disclosure.

FIG. 2 is a diagram for explaining the phenomenon of electromagnetically induced grating formed by an embodiment of the present disclosure.

Referring to FIG. 1, the electromagnetically induced grating-based electric field detection system according to an embodiment of the present disclosure may include an irradiation light source 200, a combined light source 300, a vapor cell 100, a reflector 400, and an electromagnetic wave generator 500, and a reflected light detector 600.

The irradiation light source 200 may irradiate irradiation light 1 to be incident on one end of the vapor cell 100, and the combined light source 300 may irradiate combined light 2 to be incident on the other end of the vapor cell 100. That is, the irradiation light 1 and the combined light 2 may be incident on the vapor cell 100 in opposite directions.

According to an embodiment, the irradiation light 1 and the combined light 2 may be implemented as laser lights, and the irradiation light source 200 and the combined light source 300 may include laser generating devices. For example, the irradiation light source 200 and the combined light source 300 may include laser diodes such as vertical cavity surface emitting laser (VCSEL) diodes.

According to an embodiment, the combined light 2 may have a wavelength of 480 nm.

The irradiation light 1 or combined light 2 (e.g., laser light) generated from the irradiation light source 200 or combined light source 300 may be incident on and released from the vapor cell 100.

The vapor cell 100 may contain therein vaporized alkali atoms, for example, cesium (Cs) or rubidium (Rb) atoms. In this regard, the alkali atom may undergo a change in energy level due to the laser light incident on the vapor cell 100 and may emit laser light again.

According to an embodiment, a buffer gas and a special coating such as paraffin may be further included together with the alkali atoms within the vapor cell 100 to properly constrain the alkali atoms because the alkali atoms activated by optical pumping may make it difficult to detect frequencies stably due to their collision with the wall surfaces of the vapor cell 100 or the Doppler effect caused by their rapid movements if the alkali atoms are only contained within the vapor cell 100.

According to an embodiment, the vapor cell 100 may include a material, for example, glass, quartz, or plastic, whose surface on which the laser light is incident is transparent so that the laser light generated from the irradiation light source 200 or the combined light source 300 can transmit therethrough.

It has been known through related technologies that when a specific laser is irradiated to the vapor cell 100 containing alkaline atoms therein, an atomic system in a Rydberg EIT (electromagnetically induced transparency) state can be formed and an electromagnetically induced transparency signal can be obtained. The configuration of the irradiation light source 200, the combined light source 300, and the vapor cell 100 described above is a configuration for constituting an atomic system in the Rydberg EIT state and obtaining an electromagnetically induced transparency signal.

According to an embodiment, it would be preferable that the phenomenon of electromagnetically induced transparency formed through the configuration of the irradiation light source 200, the combined light source 300, and the vapor cell 100 of the present disclosure is based on a ladder-type electromagnetically induced transparency structure.

According to an embodiment, the electromagnetically induced grating-based electric field detection system may further include an irradiation light detector 10 or a Rydberg-EIT monitoring system 20, and the irradiation light detector 10 or the Rydberg-EIT monitoring system 20 may be used to detect and analyze the irradiation light that has passed through the vapor cell, and to monitor the phenomenon of electromagnetically induced transparency formed in the vapor cell.

The reflector 400 may reflect the combined light 2 that has passed through the vapor cell 100 to make the same incident on one end of the vapor cell 100. That is, the combined light 2 reflected through the reflector 400 is incident on a surface of the vapor cell opposite to another surface of the vapor surface where the combined light 2 irradiated from the combined light source 300 is incident on the vapor cell 100. The direction of travel of the combined light 2 reflected through the reflector 400 is opposite to the direction of travel of the combined light 2 before being reflected through the reflector 400. As a result, the combined light 2 can be converted into a standing wave, and the phenomenon of electromagnetically induced grating is generated inside the vapor cell 100.

This is because, as shown in FIG. 2, the absorption rate periodicity is generated by the standing wave coupled light 2.

Referring to FIG. 2, since the intensity of the combined light 2 is 0 at the node indicated by the solid arrow, linear absorption of the irradiation light 1 occurs. On the other hand, at the anti-node indicated by the broken line arrow, the maximum amplitude of the coupled light 2 increases to twice that of the coupled light 2 before the standing wave is generated, so the phenomenon of electromagnetically induced transparency of a large signal occurs.

In other words, this periodic difference in absorption rate creates periodicity of the refractive index, which leads to the occurrence of the phenomenon of electromagnetically induced grating. Additionally, when the electromagnetically induced grating is generated, reflected light 3 is generated at near the resonance frequency.

The electromagnetic wave generator 500 may generate electromagnetic waves to be incident on one side surface of the vapor cell 100. The electromagnetic wave refers to a wave consisting of two components, i.e., an electric field and a magnetic field, and an electromagnetic wave of an appropriate wavelength may be selected according to various embodiments.

When an electromagnetic wave is incident through the electromagnetic wave generator 500 on the vapor cell 100 in which the phenomenon of electromagnetically induced grating occurs, Autler-Towns splitting occurs in the electromagnetically induced transparency of the anti-node, thereby reducing the phenomenon of electromagnetically induced transparency at the resonance frequency.

When the phenomenon of electromagnetically induced transparency decreases at the resonance frequency, the contrast of the periodicity resulting from the difference in absorption rate decreases, so the shape of the electromagnetically induced grating is weakened, thereby reducing the amount of reflection of the reflected light 3.

That is, as the intensity of the electromagnetic wave incident on the vapor cell 100 in which the phenomenon of electromagnetically induced grating occurs increases, the reduction rate of the reflected light 3 will also increase, and thus by measuring the reduction rate of the reflected light 3, the intensity of the electromagnetic wave can be measured.

The reflected light detector 600 can detect the reflected light 3 released from the vapor cell 100. The reflected light detector 600 may include various devices capable of detecting light (e.g., laser light). For example, it may include a photo diode or the like.

According to an embodiment, the reflected light detector 600 may further include a measuring part of reflected light 3, a calculating part of change amount of reflected light 3, and an electromagnetic wave calculating part.

The measuring part of reflected light 3 can measure the intensity of the reflected light 3 released from the vapor cell 100.

The calculating part of change amount of reflected light 3 can calculate the amount of change in the reflected light 3 caused by an electromagnetic wave incident on the vapor cell 100.

The electromagnetic wave calculating part can calculate the intensity and phase of an electromagnetic wave incident on the vapor cell 100 based on the amount of change in the reflected light 3.

According to an embodiment, the electromagnetically induced grating-based electric field detection system may further include a dichroic mirror 700 which is disposed between the one end of the vapor cell 100 and the reflector 400, and through which the combined light 2 that has passed through the vapor cell 100 passes.

In addition, according to an embodiment, the electromagnetically induced grating-based electric field detection system may further include a collimator 800 which converts the irradiation light 1 or the combined light 2 to be incident on the vapor cell 100 into parallel light.

As for a method according to an embodiment of the present disclosure, the contents of the above-described system may be applied thereto. Hereinafter, in relation to the method, detailed descriptions of the same contents as those of the above-described system will be omitted.

Figure 3:
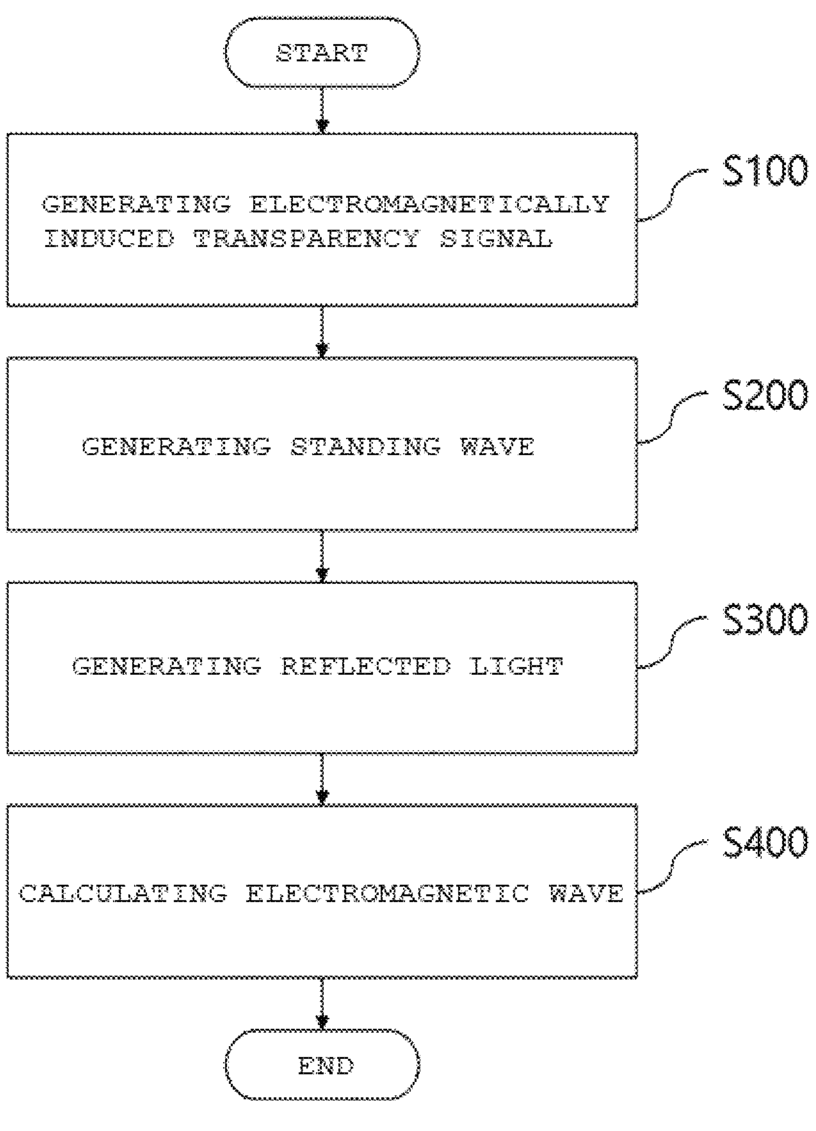
FIG. 3 is a flowchart of an electromagnetically induced grating-based electric field detection method according to an embodiment of the present disclosure.

FIG. 3 is a flowchart of an electromagnetically induced grating-based electric field detection method according to an embodiment of the present disclosure.

Referring to FIG. 3, the electromagnetically induced grating-based electric field detection method according to an embodiment of the present disclosure may include the steps of generating an electromagnetically induced transparency signal (S100), generating a standing wave (S200), generating a reflected light (S300), and calculating an electromagnetic wave (S400).

In the step of generating the electromagnetically induced transparency signal (S100), the irradiation light 1 and the combined light 2 may be incident on the vapor cell 100 in opposite directions to generate a Rydberg electromagnetically induced transparency signal.

In the step of generating the standing wave (S200), the combined light 2 which has passed through the vapor cell 100 may be reflected through the reflector 400, so that the reflected combined light 2 can be incident into the vapor cell 100 to generate the standing wave.

In the step of generating the reflected light (S300), the reflected light 3 may be released from the vapor cell 100 by adjusting the angle at which the irradiation light 1 is incident on the vapor cell 100.

In the step of calculating the electromagnetic wave (S400), the electromagnetic wave is allowed to be incident on the vapor cell 100 through the electromagnetic wave generator 500, and then, based on the amount of change in the reflected light 3 caused by the incident electromagnetic wave, the intensity and phase of the electromagnetic wave may be calculated.

According to an embodiment, the wavelength of the combined light 2 may be in a range from 479 nm to 489 nm.

According to an embodiment, in the step of generating the standing wave (S200), the combined light 2 may pass through the dichroic mirror 700 and then be reflected using the reflector 400.

Figure 4:
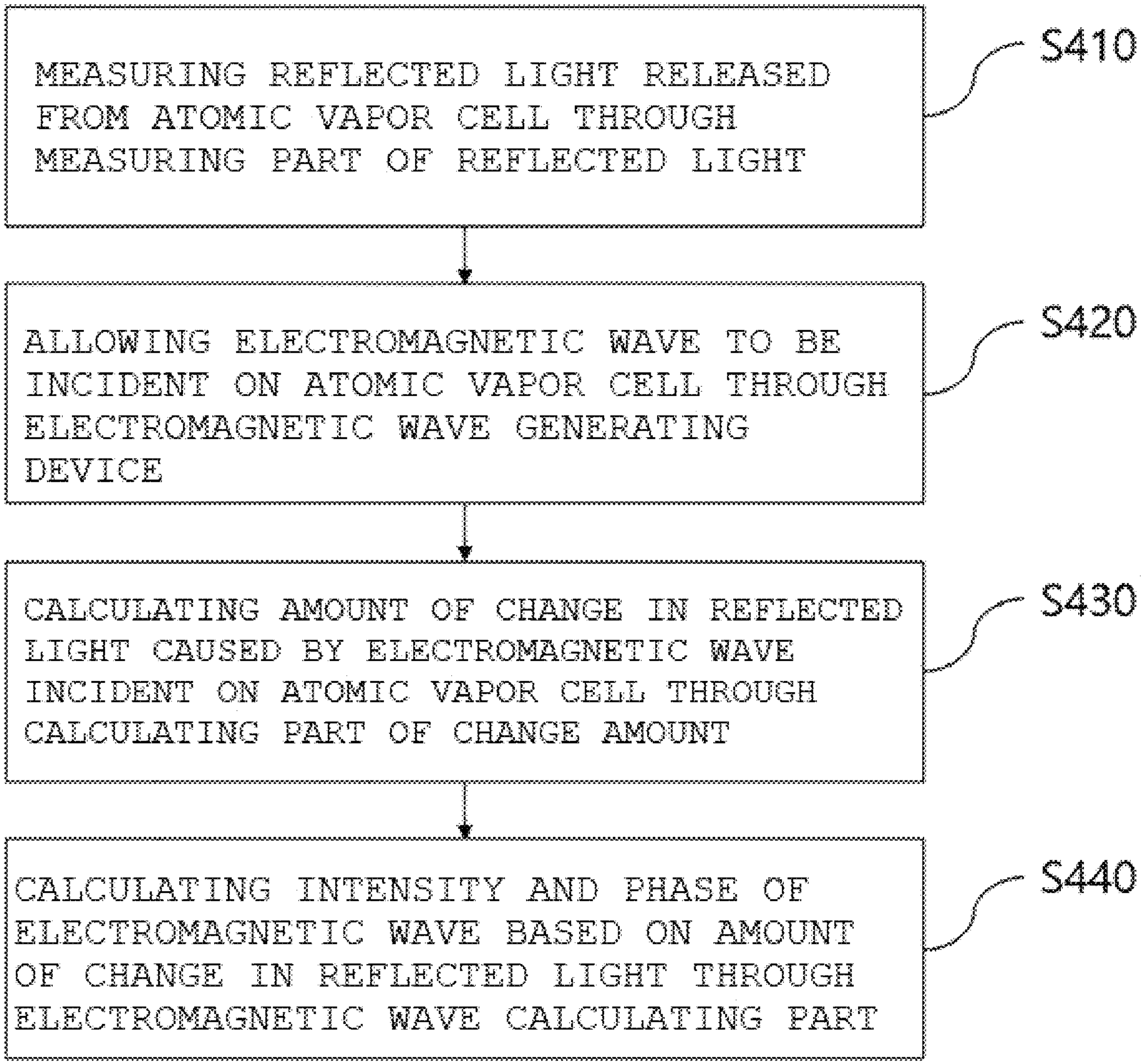
FIG. 4 is a flowchart of the step of calculating the electromagnetic wave according to an embodiment of the present disclosure.

FIG. 4 is a flowchart of the step of calculating the electromagnetic wave (S400) according to an embodiment of the present disclosure.

Referring to FIG. 4, the step of calculating the electromagnetic wave (S400) according to an embodiment of the present disclosure may further include the steps of measuring the reflected light 3 released from the vapor cell 100 through the measuring part of reflected light 3 (S410), allowing an electromagnetic wave to be incident on the vapor cell 100 through the electromagnetic wave generator

500 (S420), calculating the amount of change in the reflected light 3 caused by the electromagnetic wave incident on the vapor cell 100 through the calculating part of change amount of reflected light (S430), and calculating the intensity and phase of the electromagnetic wave based on the amount of change in the reflected light 3 through the electromagnetic wave calculating part (S440).

Meanwhile, in the above-described method, the step of calculating the electromagnetic wave (S400) can be prepared as a program that can be executed on a computer, and can be implemented in a general-purpose digital computer that operates the program using a computer-readable recording medium.

The aforementioned description of the present disclosure is just an example, and a person having ordinary skill in the art to which the present disclosure pertains may understand that it can be easily modified into other specific configuration without changing the technical idea or essential features of the present disclosure. Accordingly, it should be understood that the embodiments described above are illustrative and not restrictive in every respect. For example, the respective components described as a singular form may be implemented in a distributed form, and likewise the respective components described as a distributed form may be implemented in a combined form.

The scope of the disclosure is defined by the following claims rather than the detailed description, and all changed or modified forms derived from the meaning and scope of the claims and equivalents thereto should be interpreted as being included in the scope of the disclosure.

The invention claimed is:

1. An electromagnetically induced grating-based electric field detection system comprising:

a vapor cell;

an irradiation light source configured to irradiate irradiation light to be incident on one end of the vapor cell;

a combined light source configured to irradiate combined light to be incident on another end of the vapor cell;

a reflector configured to reflect the combined light that has passed through the vapor cell and to direct the reflected combined light to be incident on the one end of the vapor cell;

an electromagnetic wave generator configured to generate an electromagnetic wave to be incident on one side surface of the vapor cell; and a reflected light detector configured to detect reflected light released from the vapor cell, wherein the reflector is disposed such that the combined light that has passed through the vapor cell is reflected and the reflected combined light is incident on the vapor cell in a direction opposite to a direction of travel of the combined light before being reflected, thereby forming a standing wave of the combined light in the vapor cell, and wherein an angle at which the irradiation light is incident on the vapor cell is adjustable such that reflected light is released from the vapor cell.

2. The electromagnetically induced grating-based electric field detection system of claim 1, wherein the combined light has a wavelength in a range from 479 nm to 489 nm.

3. The electromagnetically induced grating-based electric field detection system of claim 1, further comprising:

a dichroic mirror disposed between the one end of the vapor cell and the reflector, the dichroic mirror being configured to allow the combined light that has passed through the vapor cell to pass therethrough.

4. The electromagnetically induced grating-based electric field detection system of claim 1, further comprising:

a collimator configured to convert the irradiation light or the combined light incident on the vapor cell into parallel light.

5. The electromagnetically induced grating-based electric field detection system of claim 1, wherein the reflected light detector includes:

a measuring part of reflected light configured to measure the intensity of the reflected light released from the vapor cell;

a calculating part of an amount of change of reflected light configured to calculate the amount of change in the reflected light caused by the electromagnetic wave incident on the vapor cell; and an electromagnetic wave calculating part configured to calculate the intensity and phase of the electromagnetic wave incident on the vapor cell based on the amount of change in the reflected light.

6. An electromagnetically induced grating-based electric field detection method comprising:

generating an electromagnetically induced transparency signal in which irradiation light and combined light are incident on a vapor cell in opposite directions to generate a Rydberg electromagnetically induced transparency signal;

generating a standing wave in which the combined light that has passed through the vapor cell is reflected through a reflector, so that the reflected combined light is incident on the vapor cell to generate a standing wave;

generating reflected light in which the reflected light is released from the vapor cell by adjusting an angle at which the irradiation light is incident on the vapor cell; and calculating an electromagnetic wave in which the electromagnetic wave is incident on the vapor cell through an electromagnetic wave generator, and then, based on an amount of change in the reflected light caused by the incident electromagnetic wave, the intensity and phase of the electromagnetic wave are calculated.

7. The electromagnetically induced grating-based electric field detection method of claim 6, wherein the wavelength of the combined light is in a range from 479 nm to 489 nm.

8. The electromagnetically induced grating-based electric field detection method of claim 6, wherein in the step of generating the standing wave, the combined light passes through a dichroic mirror and then is reflected using the reflector.

9. The electromagnetically induced grating-based electric field detection method of claim 6, wherein the step of calculating the electromagnetic wave includes:

measuring the reflected light released from the vapor cell through a measuring part of reflected light;

allowing an electromagnetic wave to be incident on the vapor cell through the electromagnetic wave generator;

calculating the amount of change in the reflected light caused by the electromagnetic wave incident on the vapor cell through a calculating part of change amount; and calculating the intensity and phase of the electromagnetic wave based on the amount of change in the reflected light through an electromagnetic wave calculating part.

* * * * *